United States Patent
Zhao

(10) Patent No.: US 6,509,623 B2
(45) Date of Patent: Jan. 21, 2003

(54) MICROELECTRONIC AIR-GAP STRUCTURES AND METHODS OF FORMING THE SAME

(75) Inventor: Bin Zhao, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/967,115

(22) Filed: Sep. 28, 2001

(65) Prior Publication Data

US 2002/0016058 A1 Feb. 7, 2002

Related U.S. Application Data

(62) Division of application No. 09/594,851, filed on Jun. 15, 2000.

(51) Int. Cl.$^7$ .............................................. H01L 29/72
(52) U.S. Cl. ..................... 257/522; 257/758; 438/619; 438/780; 438/781; 438/623
(58) Field of Search ................. 257/522, 414, 257/758; 438/619, 780, 781, 623

(56) References Cited

U.S. PATENT DOCUMENTS

| | | | |
|---|---|---|---|
| 5,324,683 A | | 6/1994 | Fitch et al. |
| 5,652,559 A | * | 7/1997 | Saia et al. ..................... 335/78 |
| 5,883,009 A | * | 3/1999 | Villa et al. ................... 438/739 |
| 5,903,041 A | | 5/1999 | LaFleur et al. .............. 257/530 |
| 6,054,381 A | * | 4/2000 | Okada ........................ 438/624 |
| 6,057,226 A | * | 5/2000 | Wong ......................... 438/623 |
| 6,159,840 A | * | 12/2000 | Wang ......................... 438/618 |
| 6,165,890 A | | 12/2000 | Kohl et al. .................. 438/619 |
| 6,211,561 B1 | | 4/2001 | Zhao .......................... 257/522 |
| 6,229,195 B1 | * | 5/2001 | Kagamihara ................ 257/522 |
| 6,277,705 B1 | * | 8/2001 | Lee ............................. 438/421 |

* cited by examiner

Primary Examiner—Matthew Smith
Assistant Examiner—V. Yevsikov
(74) Attorney, Agent, or Firm—Farjami & Farjami LLP

(57) ABSTRACT

An improved microelectronic structure is disclosed. The improved structure includes an air-gap region formed by removing an insulating material through an aperture residing in a mask.

25 Claims, 8 Drawing Sheets

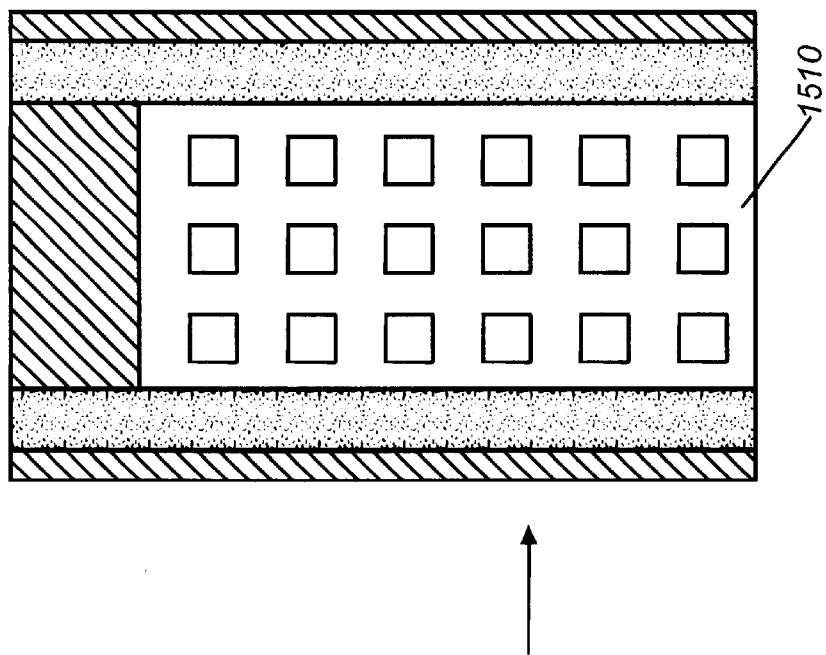
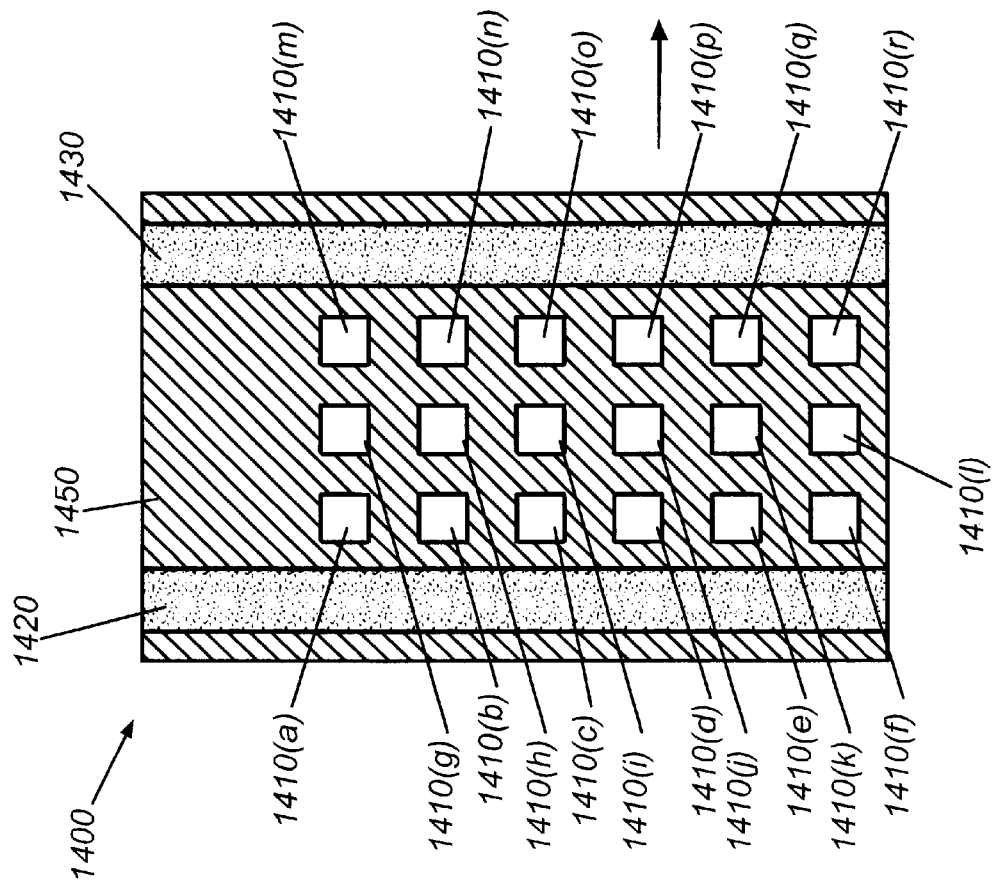

MICROELECTRONIC AIR-GAP STRUCTURES AND METHODS OF FORMING THE SAME

CROSS-REFERENCE TO RELATED APPLICATION

This application is a divisional of copending U.S. utility application entitled, "Microelectronic Air-Gap Structures And Methods Of Forming The Same," having Ser. No. 09/594,851, filed Jun. 15, 2000, which is entirely incorporated herein by reference.

BACKGROUND OF THE INVENTION

1. Field of the Invention

The present invention generally relates to microelectronic structures. More particularly, the present invention relates to microelectronic air-gap regions.

2. Related Art

Integrated circuits often include multiple devices formed within a substrate and multiple levels of interconnect which connect the devices to form functional circuits. Device size and interconnect feature size and spacing generally affect manufacturing costs and performance of the integrated circuits. For example, manufacturing costs per chip may be reduced by reducing device and interconnect feature size and spacing. In particular, as the feature size and spacing are reduced, smaller chips can be fabricated for the same circuit and each semiconductor wafer can yield more chips. In addition, device performance generally improves as device feature size is reduced. For example, device speed increases and power consumption decreases as the device feature size decreases. Accordingly, circuits having relatively small devices are generally desirable.

Unfortunately, reducing interconnect feature size and spacing may deleteriously affect circuit performance. For example, as the separation between interconnect features decreases, the circuit becomes increasingly affected by capacitance coupling between two or more interconnect features separated by a dielectric material. Furthermore, as interconnect feature size decreases, the resistance of the feature generally increases (e.g., line resistance increases). As a result, the circuits become increasingly susceptible to crosstalk and to resistance-capacitance ("RC") delays as the capacitance coupling between interconnect features and interconnect line resistance increase.

Generally, the capacitance of two or more conductive features is proportional to the dielectric constant of a material separating the features and inversely proportional to the distance between the features. Consequently, the capacitance coupling of features increases as the distance between the features decreases and as the dielectric constant of material between the features increases. Adverse affects of reduced spacing between interconnect features may be mitigated by interposing material having a low dielectric constant (low-k) material between the interconnect features.

Typical dielectric material used in the manufacture of integrated circuits such as silicon oxide (SiOx) has a dielectric constant of about 4. However, interconnect structures have recently been developed which use air, having a dielectric constant of about 1, between adjacent interconnect lines within a metallization level.

Although these conventional air-gap structures overcome some of the problems associated with use of higher dielectric constant materials, circuits employing such air-gap structures may incur other problems. The conventional gap structures are typically fabricated by forming air-gaps between metal lines by depositing material conformally over the metal lines (i.e., by intentionally poor-filling the gaps between the metal lines when depositing dielectric materials used for isolation and mechanical support of the next interconnect metal layer). Thus, the number and location of the air-gap s is often determined by the interconnect layout, often resulting in extensive use of air-gap structures, which tend to weaken the structure of the circuit. In addition, air-gap regions do not conduct heat well. Thus, circuits including conventional air-gap structures tend to readily heat compared to circuits employing more conventional dielectric regions. As the circuit temperature increases, the devices and interconnect structures within the circuit become susceptible to reliability problems such as undesired diffusion of materials within the device and the interconnect. Accordingly, improved circuits having air-gap structures only at critical locations to improve performance that are mechanically strong and less susceptible to heat buildup are desired.

In addition to the problems set forth above, circuits including conventional air-gap dielectric structures may be susceptible to poisoned via problems caused by misalignment of the via plugs to underlying metal lines. Filling the mis-aligned via holes, which are connected to the air-gap due to the misalignment with the underlying metal lines, is often difficult, resulting in relatively poor contact between interconnect layers. Accordingly, improved circuits which are less susceptible to poisoned vias and methods of forming the circuits are also desired.

U.S. Pat. No. 5,342,683, issued to Fitch et al. on Jun. 28, 1994, discloses methods of forming an air-gap between two conductive features within a metallization level. One method disclosed in the Fitch et al. patent includes forming an air-dielectric region by forming sacrificial spacers within a trench, forming a pillar between the spacers, removing the spacers to form air regions, and sealing the air regions. This method results in a dielectric structure including a pillar surrounded by one or more air-gap regions. Because the dielectric constant of the pillar is generally higher than the dielectric constant of air, the resultant dielectric constant of the dielectric structure formed according to this method is higher than a structure including only air.

The Fitch et al. patent also discloses methods of forming air-gap regions using selective growth techniques. Such methods may be relatively complex and generally require additional selective growth processing steps to form a seal over the air-gap region. These additional process steps in the manufacture of microelectronic devices are undesirable because such steps typically increase the cost of the circuit and a probability that the circuits will include a defect. Accordingly, improved microelectronic circuits having air-gap dielectric regions of lower effective dielectric constant and methods to robustly and easily seal the air-gap regions are desired.

Air-gap structures may also suitably be desirable for other microelectronic structures. For example, micro electromechanical systems ("MEMS") often include air-gap regions, which define micro-mechanical structures within the MEMS. Accordingly, methods of forming air-gap structures suitable for facilitating formation of micro-mechanical structures are also desired.

SUMMARY

The present invention provides an improved microelectronic structure and method for forming the structure. More particularly, the present invention provides an improved air-gap region suitable for microelectronic structures and/or micro-mechanical structures and a method of forming the same.

The way in which the present invention addresses the drawbacks of the now-known air-gap structures and methods of forming the structures is discussed in greater detail below. In general, the invention provides improved air-gap dielectric regions which are formed using a new fabrication method which is easy to implement in manufacturing.

In accordance with an exemplary embodiment of the present invention, an air-gap dielectric structure is formed by forming a pattern of conductive or dielectric features—e.g., a pattern of interconnect lines—on a substrate, depositing a material over the patterned features and the substrate, removing any excess material if necessary, forming an etch mask having apertures configured to allow removal of the deposited material, removing the deposited material between at least some of the patterned features, and forming a seal over the apertures of the etch mask to form an air-gap region. Use of an etch mask allows relatively easy and reliable sealing of air-gap regions and provides a robust planar surface for subsequent processing. In accordance with one aspect of this embodiment, the etch mask may be patterned to allow formation of the air-gap structures only in desired areas between the patterned features on the substrate. For example, the air-gap structures may suitably be formed only between closely-spaced features or only between some of the closely spaced features, leaving solid material between other patterned features on the substrate. Leaving solid material between at least some patterned features provides additional mechanical strength to the structure and may facilitate heat transfer to the substrate. In accordance with one aspect of this embodiment, the patterned features include interconnect lines, and the mask is patterned such that solid dielectric material remains adjacent at least some conductive plugs connecting interconnect levels within a circuit. Leaving solid dielectric material adjacent the conductive plug mitigates poisoned via problems caused by any misalignment during manufacturing of the structure.

In accordance with another embodiment of the invention, a method for forming micro-mechanical structure includes forming a feature on a substrate, depositing sacrificial material on the substrate, forming an etch mask having apertures, removing at least some of the sacrificial material through the mask apertures, and sealing the mask apertures.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

FIG. 14 is a top plan illustration of a microelectronic structure in accordance with an alternate embodiment of the invention having a dielectric material and a mask; and FIG. 15 is a top plan illustration of the structure of FIG. 14 having a portion of the dielectric material removed.

DETAILED DESCRIPTION

The present invention generally relates to microelectronic structures including air-gap regions. Air-gap regions formed in accordance with the present invention may be used in a variety of circuits or other microelectronic mechanical structures such as micro electromechanical systems and the like. However, the invention is conveniently described below in connection with forming air-isolated conductive features within integrated circuits.

Figure 1:
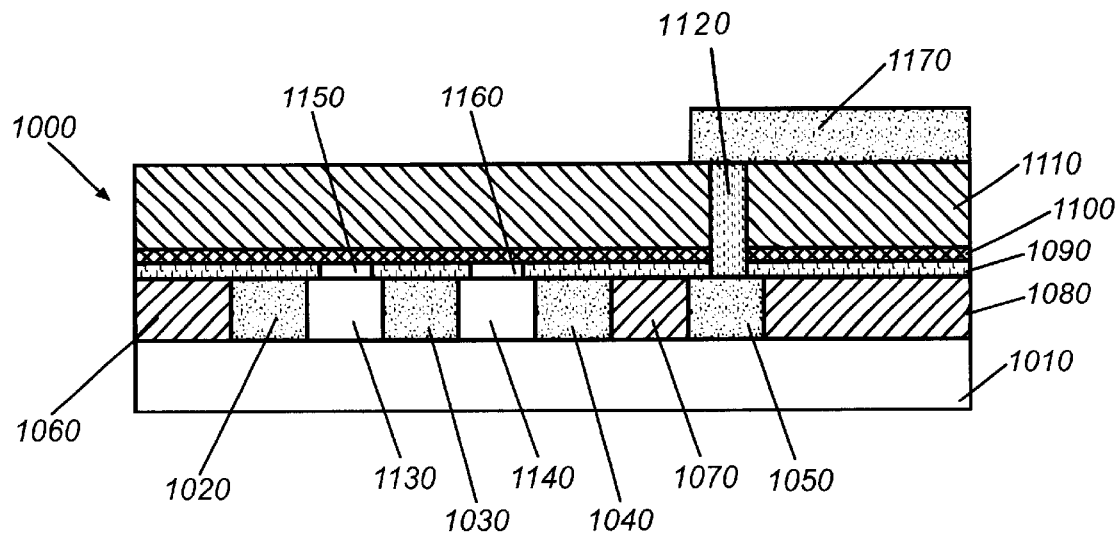
FIG. 1 is a cross-sectional illustration of an interconnect structure having an air-gap dielectric structure in accordance with an exemplary embodiment of the present invention.
Figure 2:
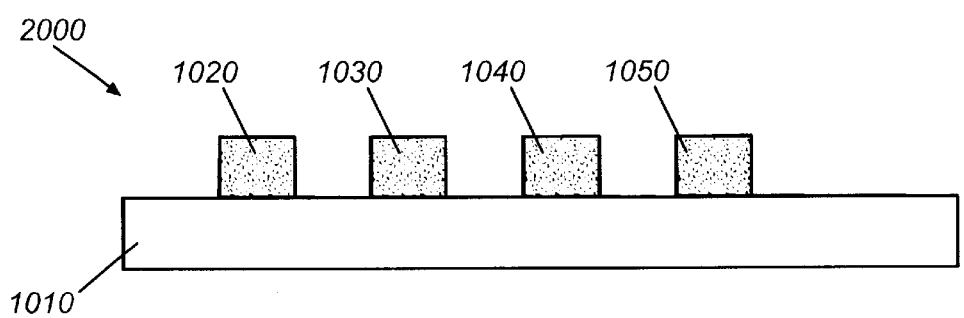
FIG. 2 is a cross-sectional illustration of a substrate having patterned features formed thereon in accordance with an exemplary embodiment of the present invention.

FIG. 1 illustrates an interconnect structure 1000 in accordance with an exemplary embodiment of the present invention. Structure 1000 is suitably configured to provide air-gap dielectric regions between at least some conductive features—e.g., between at least some closely-spaced conductive regions—and optionally provide solid dielectric material between other conductive features—e.g., conductive features spaced sufficiently far apart such that capacitance coupling of the features does not detrimentally affect circuit performance. Providing solid dielectric material between at least some conductive features may facilitate heat transfer from the structure to a substrate and may provide additional mechanical strength to structure 1000.

Exemplary structure 1000 includes a substrate 1010; conductive features 1020, 1030, 1040, and 1050; insulating features 1060, 1070, and 1080; mask layer 1090; sealing layer 1100; insulating layer 1110; conductive plug 1120; and air-gap regions 1130 and 1140.

As illustrated, structure 1000 includes air-gap regions 1130 and 1140 between closely-spaced conductive features 1020, 1030, and 1040, and includes insulating features (e.g., feature 1070) between other conductive features. In accordance with alternative embodiments of the invention, features 1070 and/or 1080 may suitably be replaced with air-gap regions and/or air-gap regions 1130 and 1140 may suitably be replaced with solid dielectric structures. Although the present embodiment illustrates air-gap regions formed between closely-spaced conductive features, some closely-spaced features may be separated by solid features such as feature 1070. Additionally, air-gap regions may desirably be formed between less closely-spaced features.

Substrate 1010 may include any material or combination of materials used in the fabrication of microelectronic devices such as insulating, semiconducting, and conducting materials. In accordance with an exemplary embodiment of the present invention, substrate 1010 includes transistors built in silicon and interconnect structures.

Insulating features 1060, 1070, and 1080 may include any insulating material such as silicon oxides, silicon nitrides, or low-k materials such as fluorinated silicon oxide. In accordance with one embodiment of the invention the insulating material is configured to allow selective removal of the insulating material to form the air-gap regions. In accordance with an exemplary aspect of the present embodiment, to mitigate problems associated with conductive feature capacitance, while providing adequate mechanical support and heat transfer, features 1060, 1070, and 1080 are formed of low-k material such as diamond like carbon, amorphous carbon, fluorinated amorphous carbon, polymer, or the like.

Mask layer 1090 is configured to mask a portion of structure 1000 during air-gap region formation and facilitate scaling or capping of the formed air-gap regions. Layer 1090 suitably includes apertures 1150 and 1160 configured to allow insulating material to be removed from air-gap regions 1130 and 1140 and provide a relatively small open area which is relatively easy to seal during subsequent processing. Aperture configuration may vary from application to application. For example, apertures 1150 and 1160 may include isotropic or symmetrical configurations—e.g., circular or square configurations. In accordance with an exemplary embodiment of the present invention, layer 1090 is formed of silicon oxide. However, other suitable materials such as silicon nitride, silicon oxynitride, and silicon carbon may be used for layer 1090.

As discussed in greater detail below and in accordance with various aspects of the present invention, mask layer 1090 may be patterned in a variety of configurations (e.g., openings formed at various locations on layer 1090) to allow removal of underlying insulating or sacrificial material and prevent removal of such material from other portions of, for example, structure 1000. In particular, mask 1090 may be configured to allow removal of the insulating material only between selected conductive features on substrate 1010.

Sealing layer 1100 is configured to form a seal over apertures 1150 and 1160, to thereby form isolated air-gap regions such as regions 1130 and 1140 between features such as conductive features 1020, 1030, and 1040. Sealing layer 1100 may be formed of any material which may be applied to layer 1090 to form air-gap regions 1130 and 1140. Such materials generally include non-conformally deposited materials. For example, the non-conformally deposited material may include a high-viscosity precursor that solidifies after application. In accordance with an exemplary embodiment of the present invention, layer 1100 includes a spin-on deposited dielectric compound such as silicate glass, silsesquioxane, polyarylene ether, polytetrafluoroethylene, polyimide, or the like. Small and symmetric apertures (e.g., apertures 1150, 1160) in mask layer 1090 help to prevent undesired filling of regions 1130, 1140 and generate a substantially planar surface for subsequent processing steps.

Insulating layer 1110 is generally configured to provide insulation between conductive features 1020–1050 and conductive features fabricated in other upper interconnect levels. Layer 1110 may also be configured to provide additional mechanical support to structure 1000. In accordance with an exemplary embodiment of the present invention, layer 1110 is formed of silicon oxide; however, other low-k materials such as silsesquioxane, polyarylene ether, polyamide, diamond like or amorphous carbon may also be used in accordance with the present invention.

Structure 1000 may also suitably include conductive plug 1120 to connect conductive feature 1050 to additional conductive features (e.g., a feature 1170). Conductive features 1050, 1170, and plug 1120 may be formed of any conductive material such as a metal. In accordance with an exemplary embodiment of the present invention, features 1050 and 1170 are formed of aluminum or its alloy and plug 1120 is formed of tungsten, although other metals such as copper may suitably be used to form any of features 1050, 1170, and 1120.

FIGS. 2–8 illustrate portions of structure 1000 through various fabrication steps. As illustrated, structure 1000 formation begins with forming interconnect conductive features 1020–1050 on substrate 1010 to form structure 2000, illustrated in FIG. 2. In accordance with an exemplary embodiment of the present invention, features 1020–1050 are formed by depositing conductive material, patterning the material with photoresist, and etching the material e.g., using a plasma etch to form structures 1020–1050. However, damascene processing techniques may alternatively be used to form a structure similar to structure 4000, illustrated in FIG. 4.

Figure 3:
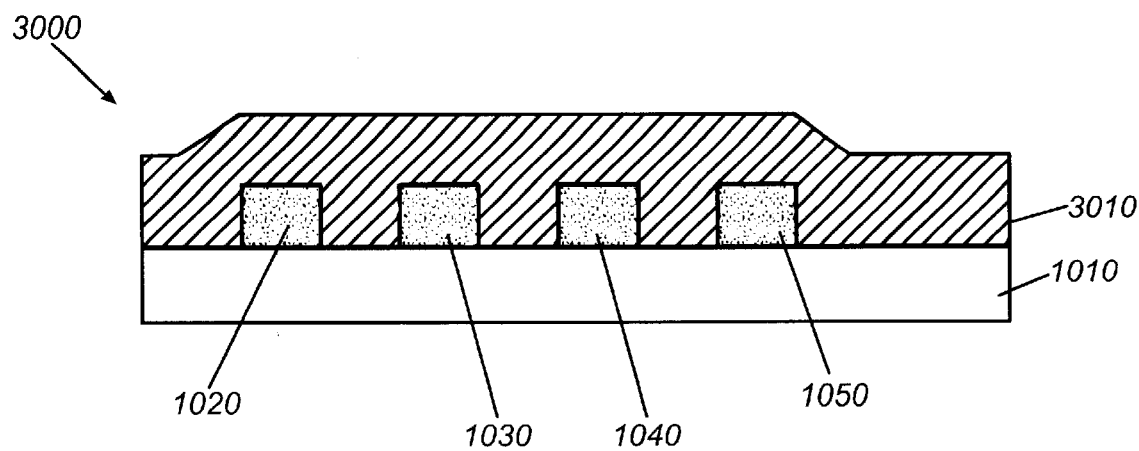
FIG. 3 is a cross-sectional illustration of the structure of FIG. 2 having a dielectric material deposited thereon in accordance with an exemplary embodiment of the present invention.

After conductive features 1020–1050 are formed, a structure 3000, illustrated in FIG. 3, is formed by depositing a dielectric material 3010 over features 1020–1050 and substrate 1010, e.g., using chemical vapor deposition (CVD) or spin-on deposition techniques. Dielectric material may be formed of any suitable material, including materials discussed above in connection with material used to form features 1060–1080.

Figure 4:
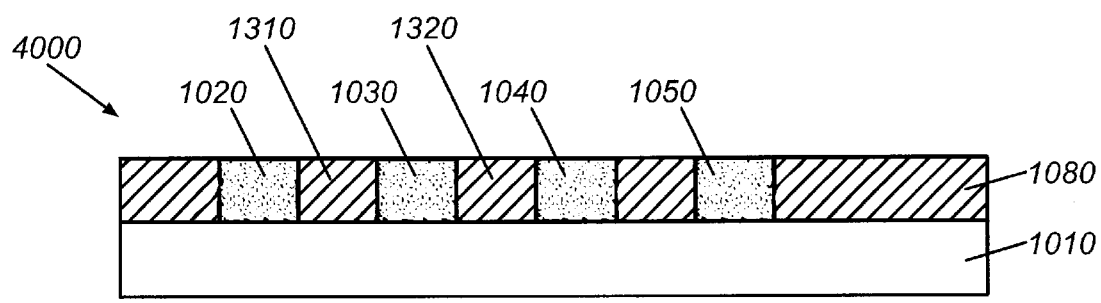
FIG. 4 is a cross-sectional illustration of the structure of FIG. 3 having a portion of the dielectric material removed in accordance with an exemplary embodiment of the present invention.
Figure 5:
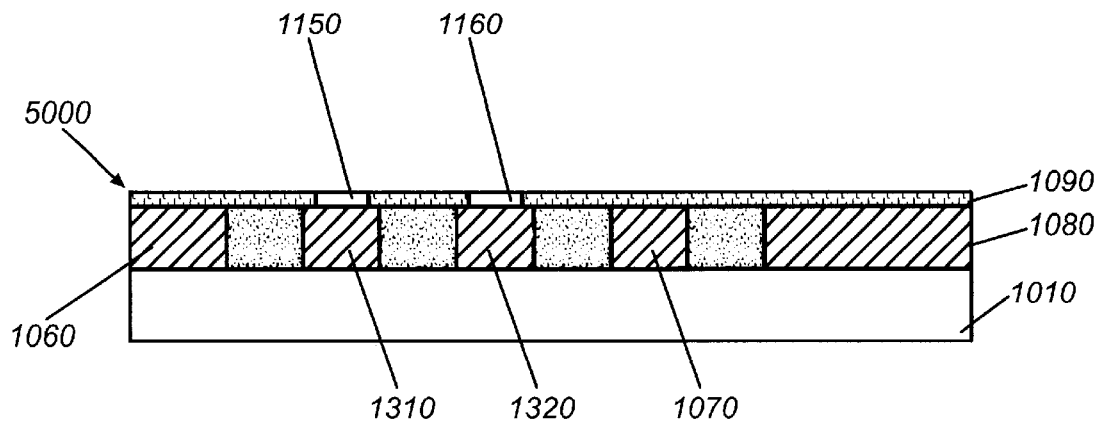
FIG. 5 is a cross-sectional illustration of the structure illustrated in FIG. 4 having an etch mask formed thereon in accordance with an exemplary embodiment of the present invention.

Next, a portion of material 3010 is removed to form structure 4000, illustrated in FIG. 4. Structure 4000 includes sacrificial etch features 1310 and 1320, which will eventually be removed to form air-gap regions 1130 and 1140. In accordance with an exemplary embodiment of the present invention, the portion of material 3010 is removed using chemical mechanical polishing (CMP) techniques. However, in accordance with alternate embodiments of the invention, the portion may be removed using other techniques such as plasma and/or wet chemical etching.

Mask layer 1090 is formed over structures 1060–1080 and 1310–1320 to facilitate removal of features 1310-1320 while preventing removal of features 1060 1080. To this end, apertures 1150 and 1160 are formed within layer 1090 above features 1310 and 1320 to form structure 5000, illustrated in FIG. 5. Mask layer 1090 may be formed using any deposition and etch process. For example, layer 1090 may be deposited using chemical vapor deposition and etched using a plasma etch process in conjunction with an appropriate photolithography technique.

Figure 6:
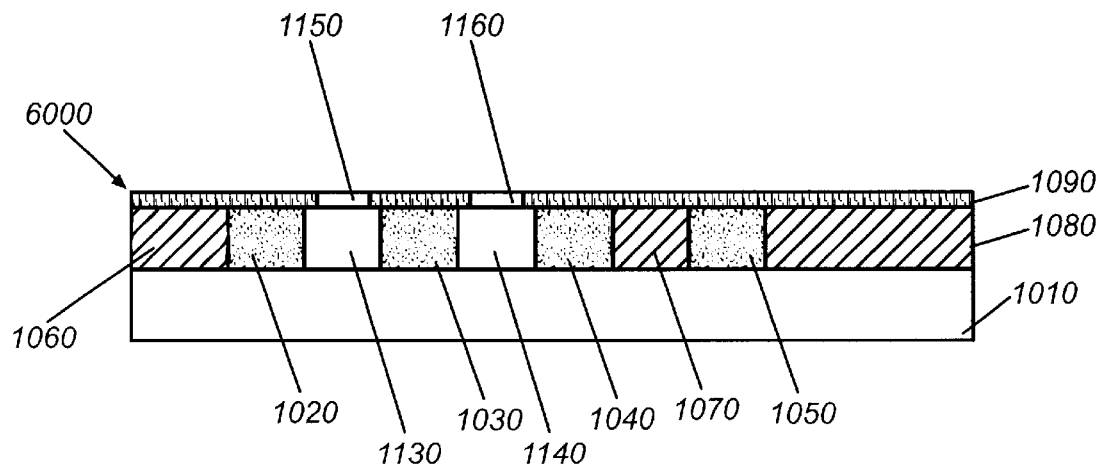
FIG. 6 is a cross-sectional illustration of the structure of FIG. 5 having air-gaps formed therein in accordance with an exemplary embodiment of the present invention.

Structure 6000, illustrated in FIG. 6, is formed by exposing structure to 5000 to a process that reacts with features 1310 and 1320 to form soluble or volatile compounds, such that at least a portion of structures 1310 and 1320 are removed. In accordance with an exemplary embodiment of the present invention, material of structures 1310 and 1320 includes carbon or fluorinated carbon and structures 1310 and 1320 material is removed by exposing structure 5000 to a plasma process—e.g., an oxygen plasma process.

In accordance with another embodiment of the present invention, features 1310 and 1320 material is removed by exposing structure 5000 to a solvent based wet removal process for example when features 1310 and 1320 are formed of a polymer material. In accordance with yet another embodiment, features 1310 and 1320 may be removed by exposing structure 5000 to both a plasma or dry process and a wet or solvent based process.

Figure 7:
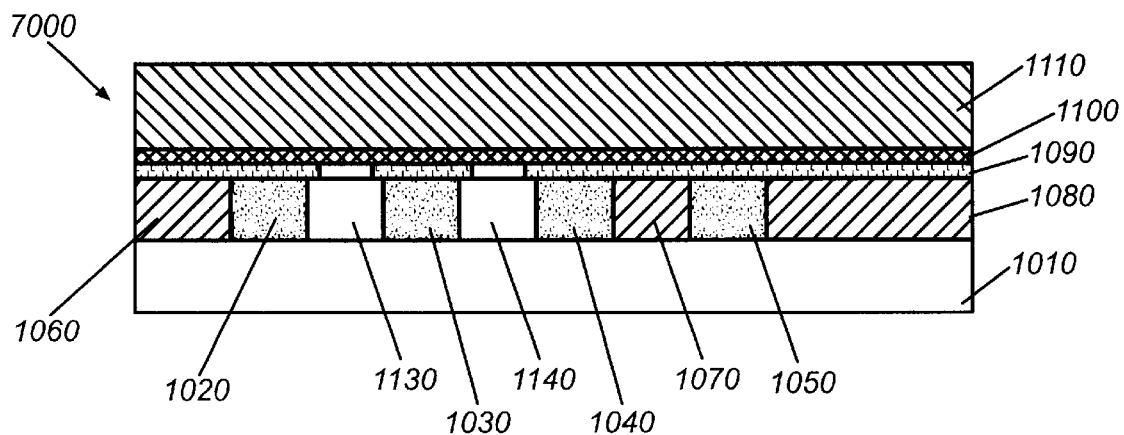
FIG. 7 is a cross-sectional illustration of the structure of FIG. 6 having a sealing layer and an insulating layer deposited thereon in accordance with an exemplary embodiment of the present invention.

After structures 1310 and 1320 or portions thereof have been removed from structure 5000, sealing layer 1100 and insulating layer 1110 are applied to structure 6000 to form structure 7000, illustrated in FIG. 7. In accordance with an exemplary embodiment of the present invention, sealing layer 1100 may be applied to structure 6000 using spin-on deposition techniques and layer 1110 may be deposited using chemical vapor deposition techniques. However, other suitable deposition processes may be used in accordance with the present invention. For example, layer 1100 may be deposited via CVD methods or the like.

Figure 8:
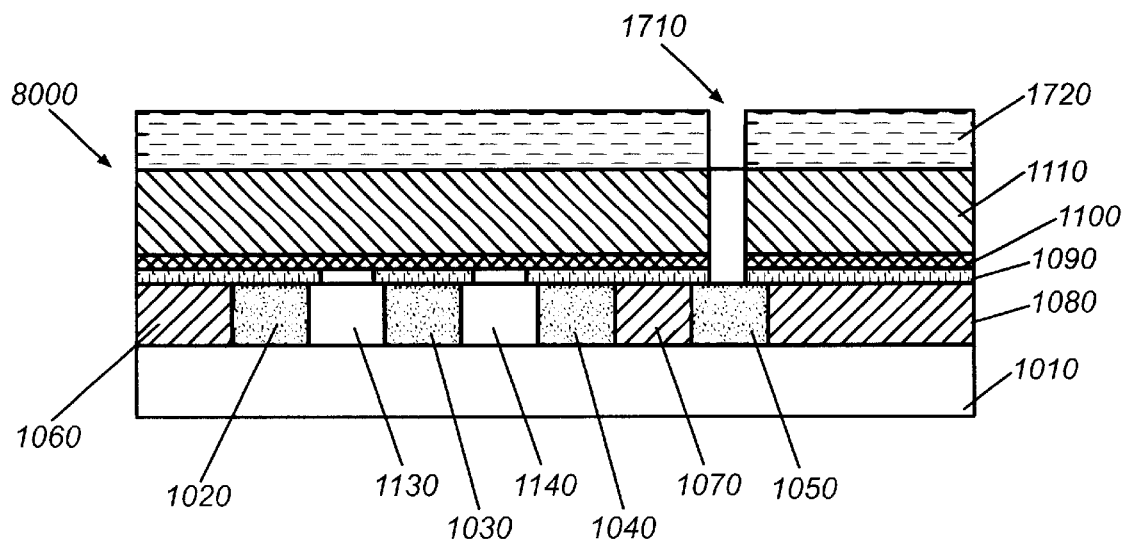
FIG. 8 is a cross-sectional illustration of the structure illustrated in FIG. 7 having a via formed within the insulating, sealing, and mask layers in accordance with an exemplary embodiment of the present invention.

Conducting plug 1120 may then suitably be formed by forming a via 1710 through insulating layer 1110, sealing layer 1100, and mask layer 1090 to form structure 8000, illustrated in FIG. 8. Via 1710 may be formed using any suitable method. However, in accordance with an exemplary embodiment of the present invention, via 1710 is formed by patterning structure 7000 with photoresist 1720 and subjecting structure 7000 to processes that react with layers 1110, 1100, and 1090 to form volatile or soluble compounds. Such processes may include wet solution etch, dry plasma etch, or a combination of these etch methods.

Finally, structure 1000 illustrated in FIG. 1 may be formed by forming plug 1120 and conductive feature 1170. Plug 1120 may be formed using any suitable method such as deposition and CMP processing, deposition and etch back techniques, or selective deposition techniques. Similarly, conductive feature 1170 may be formed using a variety of conventional techniques such as physical vapor deposition (PVD) and plasma etch techniques or damascene process techniques.

Figure 9:
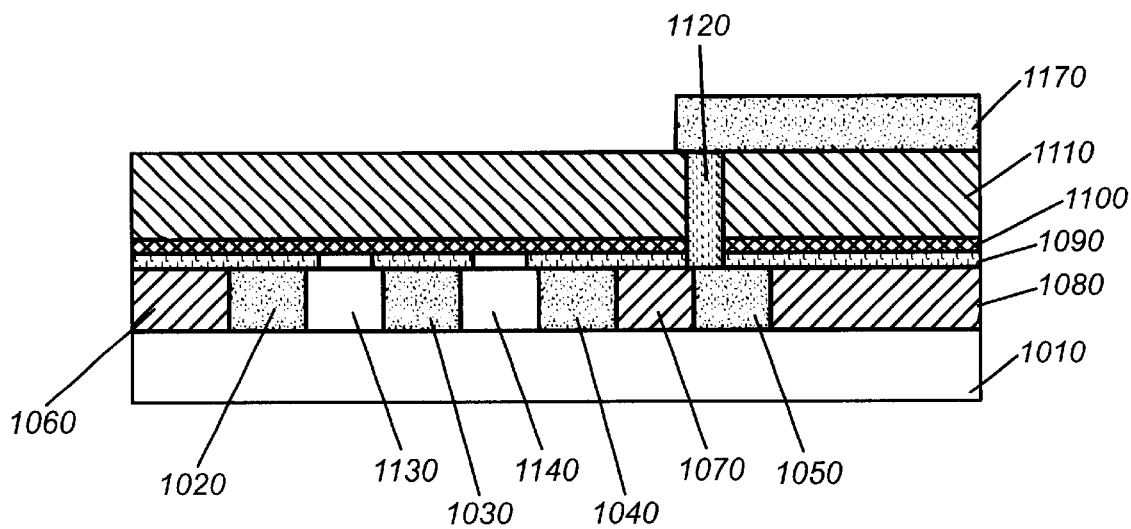
FIG. 9 is a cross-sectional illustration of a portion of a microelectronic structure showing misalignment of a conductive plug with respect to a conductive feature.
Figure 10:
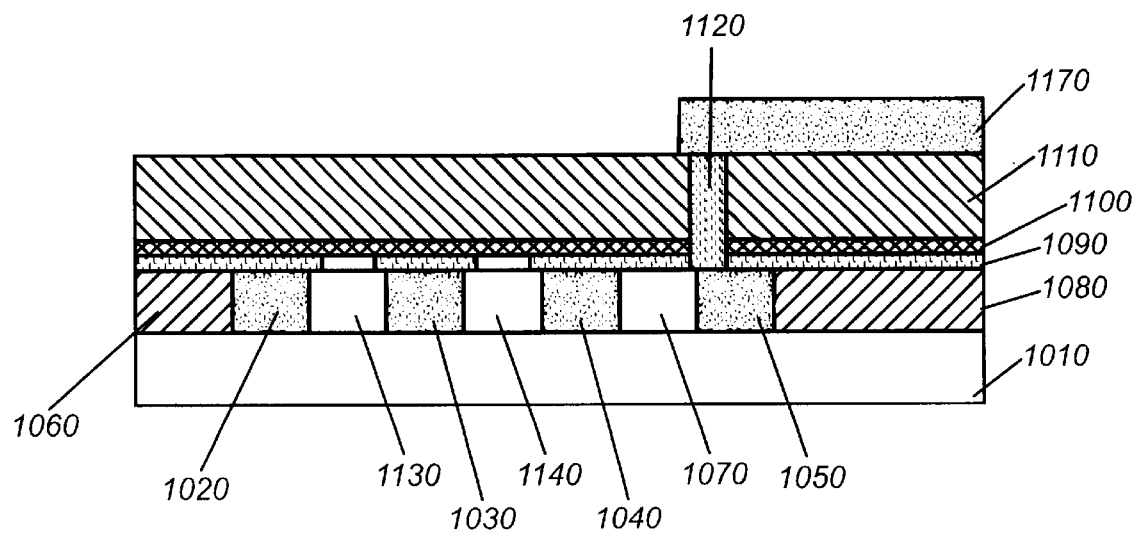
FIG. 10 is a cross-sectional illustration of a microelectronic structure having a poisoned via.

The method illustrated in FIGS. 1–8 provides protection against poison via problems due to misalignment which might arise if features 1070 and/or 1080 were removed to form an air-gap region in place of structures 1070 and/or 1080. For example, as illustrated in FIG. 9, if via 1710 is misaligned with respect to conductive feature 1050, plug 1120 would still form a relatively good contact with conductive feature 1050. However, as illustrated in FIG. 10, if dielectric feature 1070 is removed, plug 1120 may form a poor contact to feature 1050. Consequently, in accordance with the present embodiment of the invention, conductive features which are used to connect multiple metallization levels are surrounded by insulating material (e.g., features 1070 and 1080).

Figure 11:
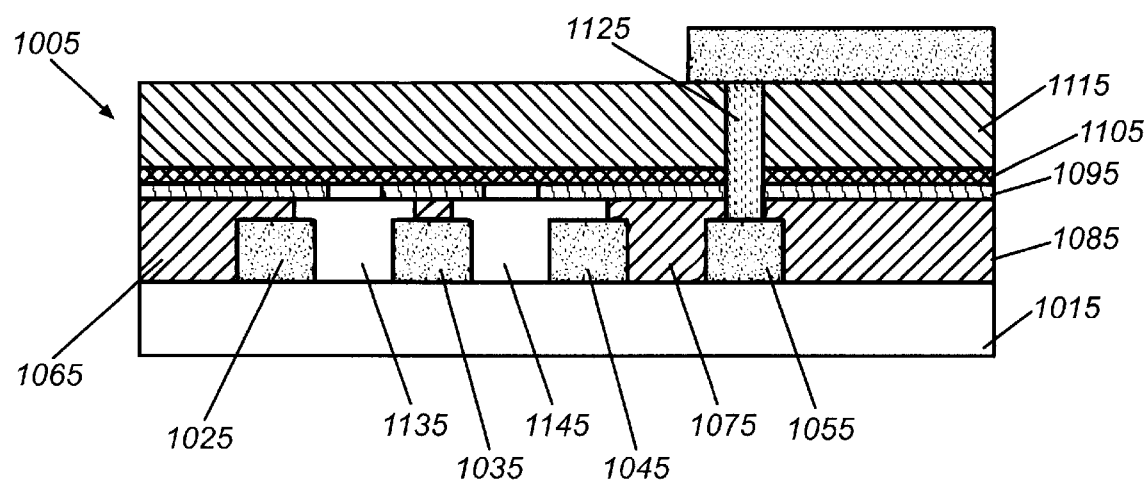
FIG. 11 is a cross-sectional illustration of a microelectronic structure having air-gap regions formed in accordance with another exemplary embodiment of the present invention.
Figure 13:
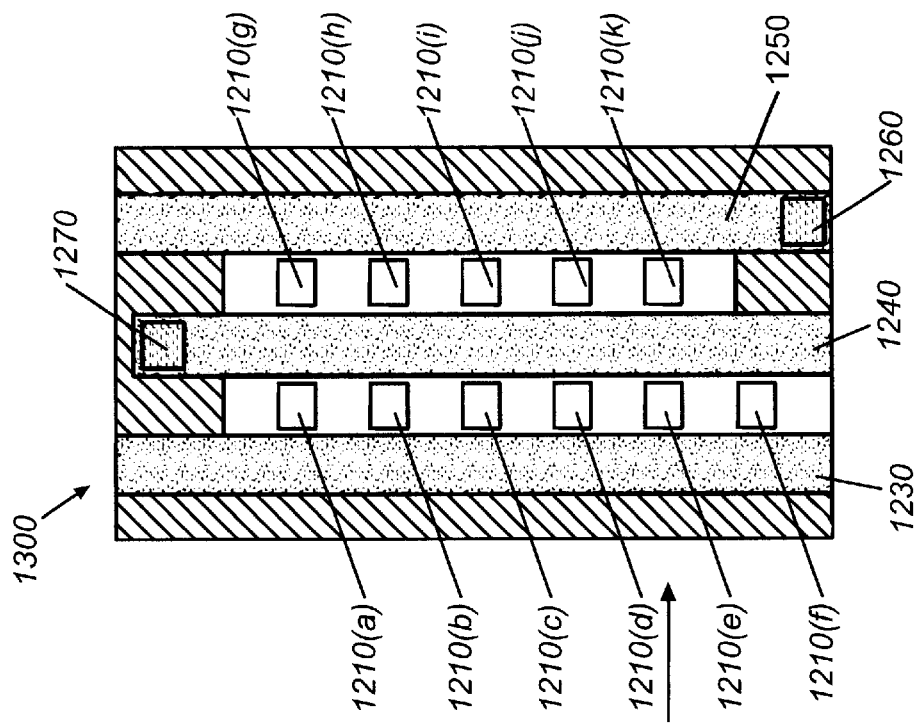
FIG. 13 is a top plan illustration of the structures of FIG. 12 having a portion of the dielectric material removed.
Figure 12:
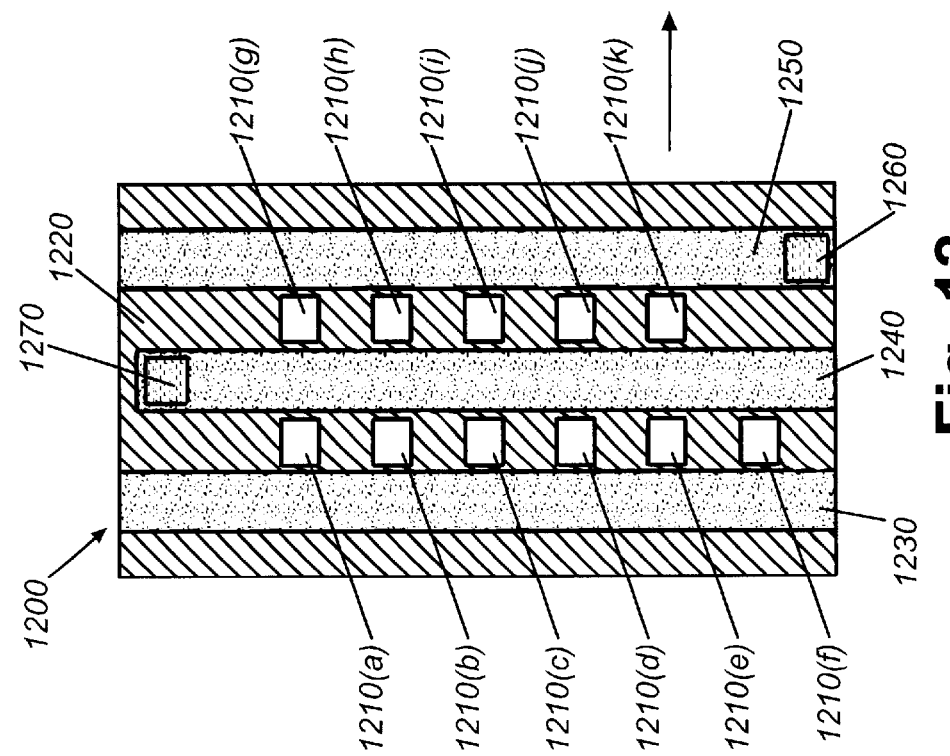
FIG. 12 is a top plan illustration of a microelectronic structure having a dielectric material and a mask.

FIG. 11 illustrates an interconnect structure 1005 in accordance with an alternate embodiment of the present invention. Structure 1005 includes a substrate 1015; conductive features 1025, 1035, and 1085; a mask layer 1095; a sealing layer 1105; an insulating layer 1115; a conductive plug 1125; and air-gap regions 1135 and 1145.

Structure 1005 may be formed using materials and processes described above in connection with structure 1000, with the exception that after completion of an insulation material removal step configured to form features 1065, 1075, and 1085, at least a portion of the insulating material remains above features 1025, 1035, 1045, and 1055. Insulating material above features 1025–1055 allows formation of air-gap regions that extend beyond a top surface of features 1025–1055.

Forming structure 1005, having air-gap regions that extend beyond a top surface of features 1025–1055 may be advantageous for several reasons. For example, formation of structure 1005 does not require removal of the insulating material to a top surface features 1025–1055. Thus, any potential damage to the top surfaces, which may occur as a result of removing the insulating material by CMP or etch back process, is mitigated. Further, forming an air-gap region that extends beyond the top surfaces of feature 1025–1055 may be advantageous because any fringe capacitance between adjacent features 1025–1055 may be reduced by the extension of low dielectric constant air-gap regions 1135, 1145.

FIGS. 12–15 illustrate top views of structures formed in accordance with embodiments of the present invention, showing various configurations of air-gap regions. Structure 1200 includes a mask layer including apertures 1210(*a*)–1210(*k*) formed above a dielectric or sacrificial material 1220, and conductive features 1230, 1240, and 1250. Conductive plugs, which are formed on top of conductive features 1240 and 1250 respectively, are represented by positions 1260 and 1270. Structure 1300 is formed by exposing structure 1200 to an environment (e.g., oxygen plasma) configured to isotropically remove material 1220 proximate apertures 1210(*a*)–1210(*k*).

As illustrated, apertures 1210(*a*)–1210(*k*) are suitably patterned such that insulating material remains in an area around features 1240 and 1250 and proximate plug locations 1260 and 1270. Leaving solid material proximate plug locations 1260 and 1270 reduces poisoned via problems, resulting from misalignment between the plugs and the previous layer of conductive features.

FIG. 14 illustrates a structure 1400 including apertures 1410(*a*)–1410(*r*) in a mask layer, features 1420 and 1430, and dielectric material 1450. Apertures 1410(*a*)–1410(*r*) are configured to allow formation of a relatively large air-gap region 1510, illustrated in FIG. 15, while allowing for seal formation above apertures 1410(*a*)–1410(*r*) e.g., using spin-on deposition or blanket CVD deposition techniques.

Although the present invention is set forth herein in the context of the appended drawing figures, it should be appreciated that the invention is not limited to the specific form shown. For example, while the process for forming an air-gap region is described in conjunction with forming air-gap regions between conductive features within a metallization level, the air-gap region may suitably be formed between non-conductive features. In this case, the conductive features described in connection with the microelectronic structure can suitably be a dielectric or semiconductive material and the dielectric material described above for circuit can be a suitable conductive or semiconductive material. Various other modifications, variations, and enhancements in the design and arrangement of the method and apparatus set forth herein, may be made without departing from the spirit and scope of the present invention as set forth in the appended claims.

I claim:

1. A microelectronic structure comprising:
   a substrate;
   a plurality of features formed on the substrate, the plurality of features having an air-gap region therebetween;
   a mask formed above said plurality of features and overlaying a portion of said air-gap region, said mask having an aperture, said aperture being configured to allow said air-gap region to be formed; and
   a seal formed over said mask.

2. The microelectronic structure of claim 1, wherein the plurality of features comprise conductive material.

3. The microelectronic structure of claim 1, wherein the mask comprises silicon oxide.

4. The microelectronic structure of claim 1, wherein the mask comprises silicon nitride.

5. The microelectronic structure of claim 1, wherein the seal comprises spin-on deposited dielectric material.

6. The microelectronic structure of claim 1, further comprising a dielectric material interposed between the features and said mask.

7. A microelectronic circuit including the microelectronic structure of claim 1.

8. A micro-mechanical structure including the microelectronic structure of claim 1.

9. A microelectronic structure including an air-gap region comprising:
   a first feature formed on a substrate;
   a second feature formed on the substrate, thereby forming a gap between the first feature and the second feature; and
   a mask having at least one aperture, the mask formed above the first feature, the second feature and the gap, and the aperture positioned above the gap so that an insulating material residing in the gap is removed through the aperture to create the air-gap region.

10. The microelectronic structure of claim 9, further comprising a seal formed over the mask such that the aperture is sealed after the insulating material residing in the gap is removed.

11. The microelectronic structure of claim 10, wherein the seal comprises spin-on deposited dielectric material.

12. The microelectronic structure of claim 10, further comprising a second insulating material formed over the seal.

13. The microelectronic structure of claim 9, wherein at least one of the first feature and the second feature comprises a conductive material.

14. The microelectronic structure of claim 9, wherein the removed insulating material comprises a dielectric material.

15. The microelectronic structure of claim 9, wherein the mask comprises silicon oxide.

16. The microelectronic structure of claim 9, wherein the mask comprises silicon nitride.

17. The microelectronic structure of claim 9, further comprising a dielectric material interposed between the features and the mask.

18. A microelectronic circuit including the microelectronic structure of claim 9.

19. A micro-mechanical structure including the microelectronic structure of claim 9.

20. A microelectronic structure, comprising:
    a first element formed on a substrate;
    a second element formed on the substrate, thereby defining a gap between the first element and the second element; and
    a region of air residing in the gap, the region of air resulting from removing a portion of insulating material residing in the gap through an aperture on a mask, the mask covering the first element, the second element and the gap, and the aperture positioned over the gap.

21. The microelectronic structure of claim 20, further comprising a seal formed over the mask after the portion of the insulating material is removed.

22. The microelectronic structure of claim 21, further comprising a second insulating material formed over the seal.

23. The microelectronic structure of claim 20, wherein the removed portion of insulating material is removed by exposing the removed portion of insulating material to an oxygen plasma.

24. The microelectronic structure of claim 20, wherein the removed portion of insulating material is removed by exposing the removed portion of insulating material to a solvent.

25. The microelectronic structure of claim 20, wherein at least one of the first element and the second element is a conductor.

* * * * *